(12) United States Patent
Provost

(10) Patent No.: US 7,893,682 B2
(45) Date of Patent: Feb. 22, 2011

(54) FOR TESTABILITY TECHNIQUE FOR PHASE DETECTORS USED IN DIGITAL FEEDBACK DELAY LOCKED LOOPS

(75) Inventor: Benoit Provost, Kanata (CA)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 12/606,352

(22) Filed: Oct. 27, 2009

(65) Prior Publication Data

US 2010/0045261 A1 Feb. 25, 2010

Related U.S. Application Data

(62) Division of application No. 11/948,936, filed on Nov. 30, 2007, now Pat. No. 7,630,846.

(51) Int. Cl.
  *G01R 23/175* (2006.01)
  *G06M 1/10* (2006.01)
  *G01R 29/00* (2006.01)
(52) U.S. Cl. .............. 324/76.54; 324/76.62; 324/76.79; 324/521
(58) Field of Classification Search .............. 324/76.54, 324/76.62, 76.79, 521
See application file for complete search history.

(56) References Cited

U.S. PATENT DOCUMENTS

| | | | |
|---|---|---|---|
| 4,890,056 A | 12/1989 | Peters et al. | |
| 5,351,000 A * | 9/1994 | Farwell | 324/76.77 |
| 6,603,300 B2 * | 8/2003 | Lin et al. | 324/76.54 |
| 2008/0172193 A1 | 7/2008 | Rhee et al. | |
| 2009/0144013 A1 | 6/2009 | Provost | |

OTHER PUBLICATIONS

Notice of Allowance received for U.S. Appl. No. 11/948,936, mailed on Aug. 11, 2009, 12 pages.

* cited by examiner

*Primary Examiner*—Amy He
(74) *Attorney, Agent, or Firm*—Cool Patent, P.C.

(57) ABSTRACT

A circuit for testing phase detectors in a delay locked loop is provided. The circuit uses a second phase detector arranged to receive the signals entering a first phase detector. Particularly, the circuit is routed such that a signal entering the D input of the first phase detector is inputted into the clock input of the second phase detector, and a signal entering the clock input of the first phase detector is inputted into the D input of the second phase detector. The circuit is also coupled to a test controller located on-die or at a high volume manufacturing (HVM) tester.

7 Claims, 4 Drawing Sheets

FOR TESTABILITY TECHNIQUE FOR PHASE DETECTORS USED IN DIGITAL FEEDBACK DELAY LOCKED LOOPS

BACKGROUND

Phase detectors used in digital feedback delay locked loops (DLLs) can suffer from timing errors such as large setup or hold times, due to large process variations. These errors result in inaccurate DLL timing, and can go unnoticed, resulting in wrong timing margining results or poor I/O performance due to inaccurate timing training.

BRIEF DESCRIPTION OF THE DRAWINGS

The claimed subject matter will be understood more fully from the detailed description given below and from the accompanying drawings of disclosed embodiments which, however, should not be taken to limit the claimed subject matter to the specific embodiment(s) described, but are for explanation and understanding only.

DETAILED DESCRIPTION

Figure 1:
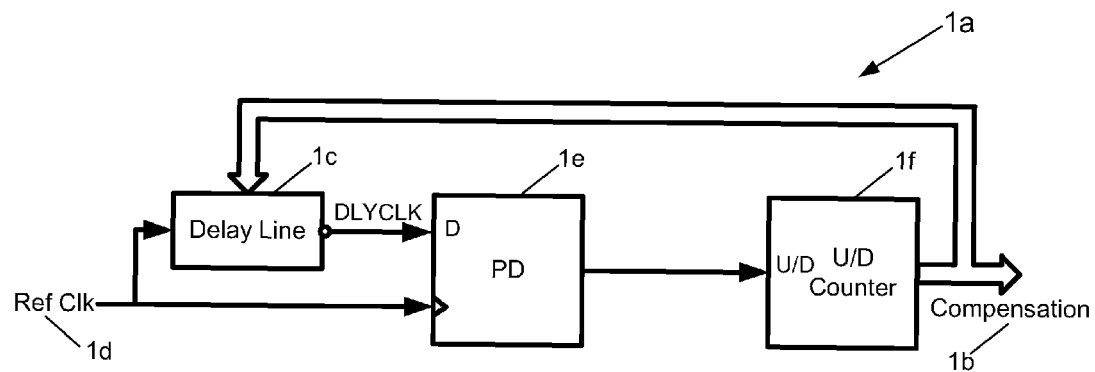
FIG. 1 shows a digital feedback delay locked loop (DLL).

Referring to FIG. 1, a block diagram of a digital feedback delay locked loop (DLL) is shown at 1a. The DLL is used to generate a required compensation value 1b (on an N-bit digital bus) to adjust an inverting delay line 1c such that the delay equals exactly one-half of a reference clock period. Delay line 1c is also referred to as "delay cell" and outputs a delayed clock signal DLYCLK. A phase detector (PD) 1e compares the edge of RefClk 1d (generated by a reference clock) to the edge of DLYCLK. Depending on which edge precedes the other, the PD output will be high or low. An up/down (U/D) counter if will either increment or decrement accordingly, which will in turn increase or decrease the delay through the adjustable delay cell. Once the closed-loop system has converged, the two clock edges are very close (within one least significant bit (LSB) of the delay cell) and the compensation value can be used to adjust other independent (but matched) delay cells in a "master/slave" fashion.

Timing errors on the PD inputs, such as setup and hold timing variations, will result in timing error on the alignment of the clock edges. This will result in the delay line converging to a different delay from half of the reference clock and a corrupted compensation value. A corrupted compensation value can be detected in high volume manufacturing (HVM) testing, but only if it significantly deviates from the expected value. A defective delay value on the delay cell can be detected in debug or in characterization processes, but not in HVM testing. Further, the timing error on PD 1e cannot be detected externally because no direct access to the PD exists. Even if such access could be added, precise timing relationship between the control signals could not be guaranteed, and therefore the test results would be meaningless.

Figure 2:
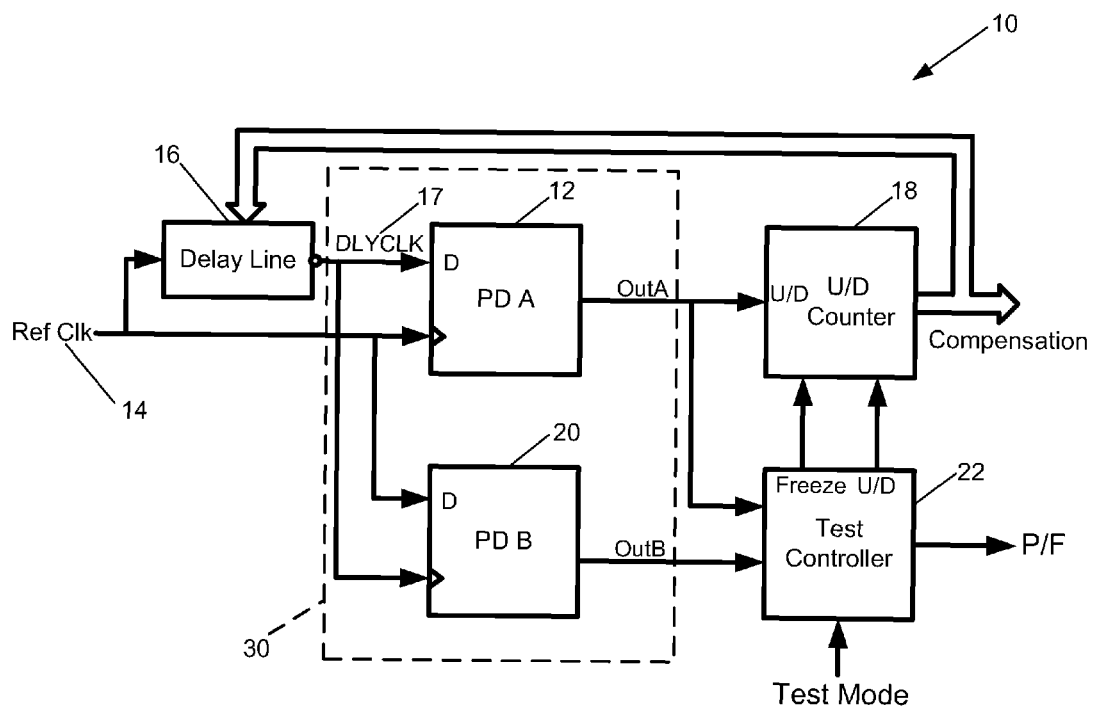
FIG. 2 shows a digital feedback DLL according to one embodiment.

Referring to FIG. 2, a circuit allowing testing of PD timing precision is provided at 10 in accordance with one embodiment. FIG. 2 illustrates a basic digital feedback DLL with additional circuitry. The circuit includes a PD 12 receiving input from a reference clock and a delay line 16. As pictured, a delayed clock signal (DLYCLK) 17 generated by delay line 16 is inputted into the D input of PD 12 while a reference clock signal (RefClk) 14 is inputted into the clock input of PD 12. The phase relation between the delayed clock and the reference clock may be configured to be exactly one-half of the reference clock period. The output of the PD 12 goes to a U/D counter 18 which may be incremented or decremented.

Circuit 10 further includes a second PD 20 identical in design to PD 12. Here, the delayed clock signal 17 is inputted into the clock input of PD 20 while the reference clock signal 14 is inputted into the D input of PD 20. In other words, the signals entering PD 20 are inverted from the signals entering PD 12.

In addition, circuit 10 may include a test controller 22. The test controller receives output OutA from PD 12 and output OutB from PD 20, and has the ability to freeze counter 18 and increment/decrement counter 18. Test controller 22 outputs a pass or fail after determining whether either of PD 12 or PD 20 is faulty.

Test controller 22 may be an on-die controller such as a finite state machine. In one embodiment, the test controller is a remote HVM tester.

All control signals are digital and the technique does not require the addition of any analog cell. In the description of the technique below, the timing errors on the PD are modeled by additional delay on either the clock input or the D input of the PD. PDs may be simple flip-flops optimized for timing precision and metastability immunity.

If both PD 12 and PD 20 are ideal and matched, their respective outputs will be inverted from each other. The PDs are considered fault-free when their additional delay on the D input and the clock input are smaller than the LSB of the delay cell. If the counter is incremented by one LSB from its converged value, one PD output will change, while the other will remain at the same state. If the counter is forced to decrement by one LSB from the converged state, the process will be inverted; the PD that did not change state will now change, and the other will remain the same. This behavior exhibits a fault-free signature of the PDs. For example, the ideal signature is: +0:01, +1:01 and −1:10. The digit to the left of the colon represents the counter position, that is, whether the counter is at an initial position (also referred to as "+0" or "(+0) counter position"), incremented by 1 (also referred to as "+1" or "(+1) counter position"), or decremented by 1 (also referred to as "−1" or "(−1) counter position"). The first digit to the right of the colon represents OutA and the second digit to the right of the colon represents OutB. These two digits of the signature may be further encoded in binary, as shown below. For example, the ideal signature may be encoded as: 1 at +0, 1 at +1 and 2 at −1. Other naming conventions may be used to describe position and behavior, and are within the scope of the claimed subject matter.

If there is some kind of timing defect on either of the two PDs, on either the clock or D input, the signature will change and may be detected as faulty. For example, incrementing the delay line by one LSB will not affect a PD with a delay error of more than one LSB, but it will affect the other PD with no delay error. This will result in the two PDs having the same output, which is different from the ideal signature. A more detailed example is described below.

Figure 3:
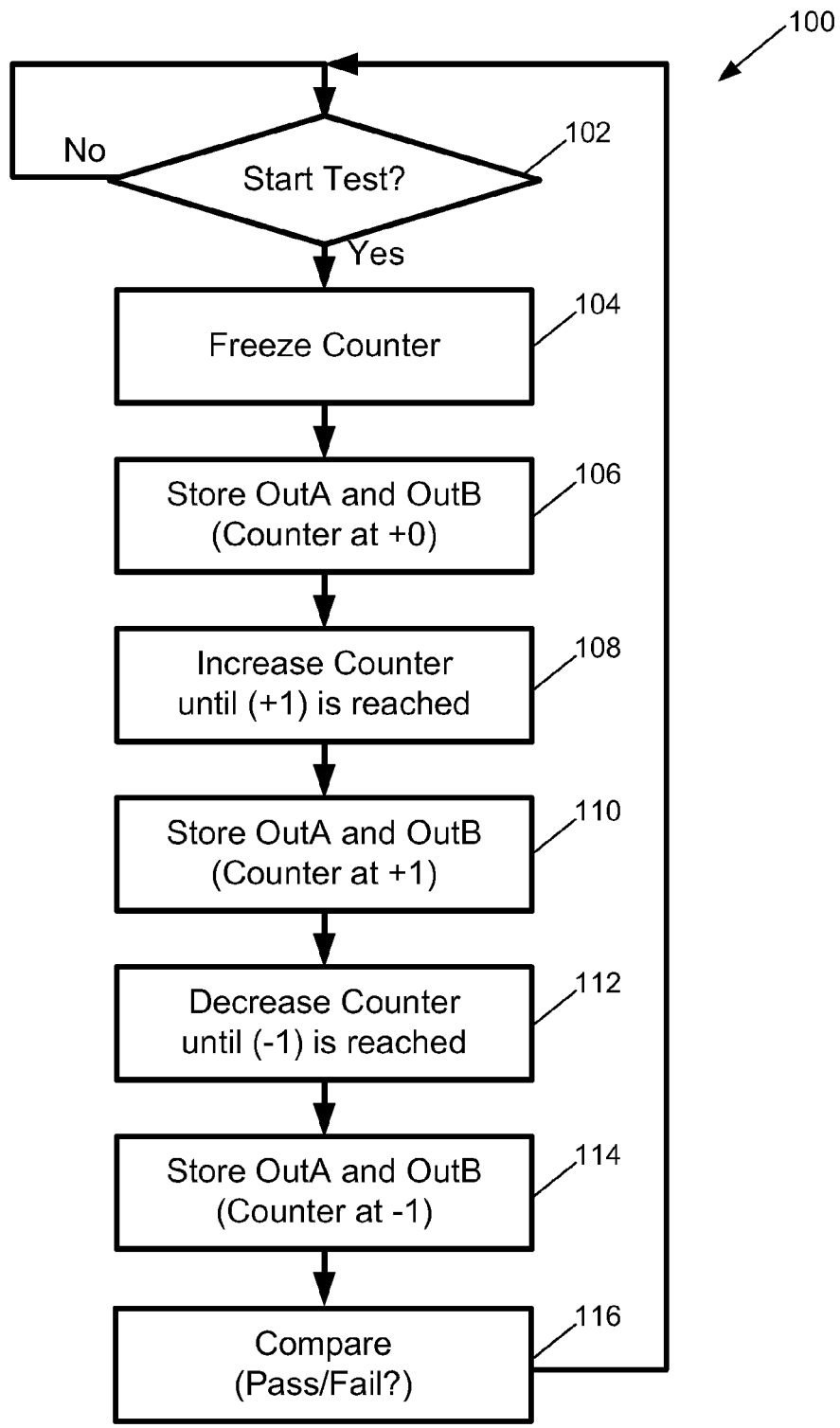
FIG. 3 is a flowchart of a method according to one embodiment.

Referring to FIG. 3, a method of testing PD timing as implemented with circuitry including a test controller is shown at 100 according to one embodiment. As mentioned previously, the test flow may either be implemented with a test controller such as an on-chip controller or by external test equipment. All control signals are low speed, therefore access through the JTAG (Joint Test Action Group) port is possible. It is assumed that the DLL has converged to its steady-state before the test starts.

Method 100 begins by having the test controller wait until it receives a "start test" signal at 102. Once the test starts, at 104, the method includes freezing the counter to the steady-state value to ensure it does not readjust during the test. At step 106, method 100 includes storing the results of PD 12 and 20 when the counter is at the (+0) counter position. If the test controller is located at the HVM tester, the results may be scanned out. At step 108, method 100 includes increasing the counter until reaching the (+1) counter position. In this case, the counter is incremented by 1. At step 110, the method includes waiting for the delay line to stabilize and then storing or scanning out the results from PD 12 and PD 20. Method 100 includes decreasing the counter until reaching the (−1) counter position at step 112. In this case, the counter is decremented by 2. At step 114, the method includes waiting for the delay line to stabilize and then storing or scanning out the results from PD 12 and PD 20. Method 100 further includes comparing the stored results with a set of fault-free signatures, such as described below, and a pass/fail decision is made. This comparison may be done using a look-up table, for example, such as Table 1, below.

It should be noted that in one embodiment, the counter may be first decreased to reach the (−1) counter position before increasing to reach the (+1) counter position. As such, from the initial counter position (+0), the counter may decrement by 1 to reach the (−1) counter position before incrementing by 2 to reach the (+1) counter position. The claimed subject matter does not necessarily require an order to reaching the counter positions.

Figure 4:
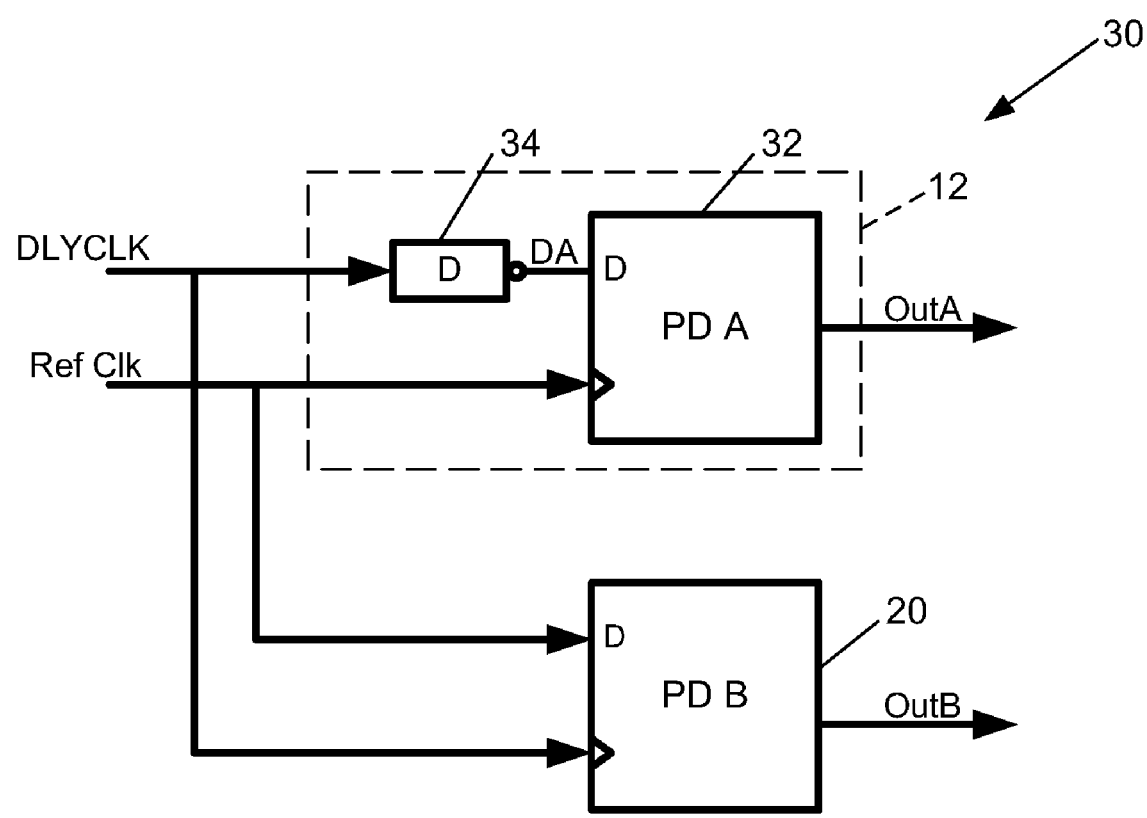
FIG. 4 is an enlarged view of a portion of FIG. 2, including modeling of a realistic phase detector.

In FIG. 4, an enlarged view of a portion of FIG. 2 is shown at 30, including a realistic modeling of PD 12. The realistic PD is represented with an ideal (fault-free) PD 32 with a delay 34 of D. The delay D may be larger than one LSB delay step on the delay line, referred to as "DLLSTP". The D input of the ideal PD 32 is DA. "Ref CLK" refers to a signal 14 from the reference clock and "DLYCLK" refers to a signal 17 from the delay line 16. The clock input entering PD 32 and both inputs on PD 20 are considered fault-free, where their input delays are in the order of ΔT or smaller, much less than DLLSTP.

Figure 5:
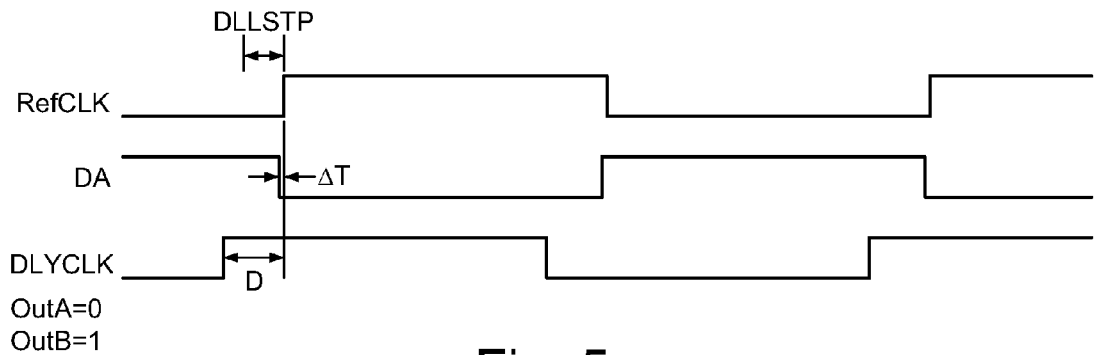
FIG. 5 is a timing diagram illustrating what occurs when the counter is at the +0 counter position, according to one embodiment.
Figure 6:
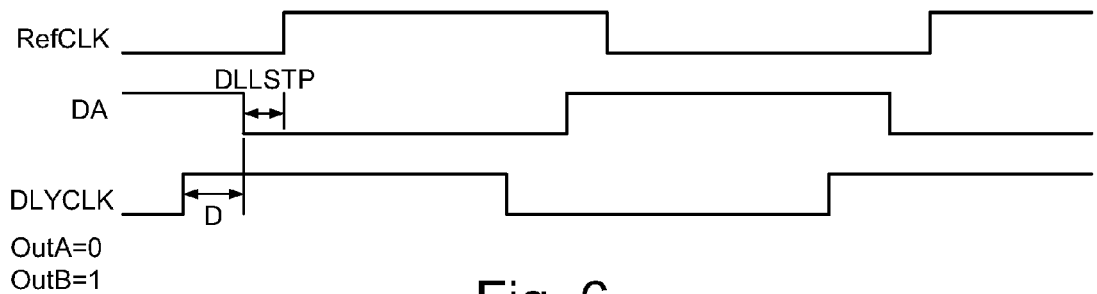
FIG. 6 is a timing diagram illustrating what occurs when the counter is at the +1 counter position, according to one embodiment.
Figure 7:
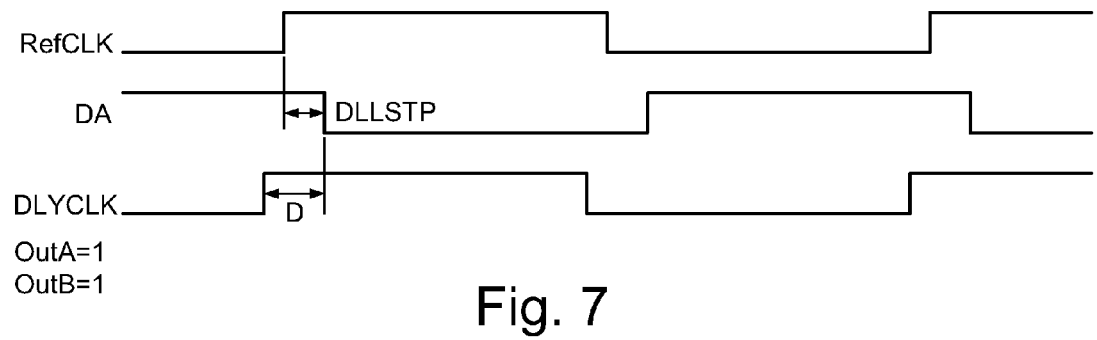
FIG. 7 is a timing diagram illustrating what occurs when the counter is at the −1 counter position, according to one embodiment.

Using the model of FIG. 4 and referring to FIGS. 5-7, for exemplary purposes, a detailed example is provided to illustrate how a defective PD may be detected. Suppose PD 12 suffers from delay mismatch such that its D input has a delay D larger than DLLSTP. FIG. 5 is a timing diagram that illustrates what occurs at an initial converged counter position where the counter position is at +0 at steady-state. Using a test controller configured to record the PD results at various counter positions, the results recorded when the counter is at the (+0) counter position are OutA=0 and OutB=1.

The counter is increased by 1 to reach the (+1) counter position and the results are recorded by the test controller. FIG. 6 is a timing diagram that illustrates what occurs at the (+1) counter position. As illustrated in FIG. 6, this will result in a reduction of the delay through the delay line by DLLSTP (ΔT is negligible with respect to DLLSTP), and the outputs will still be OutA=0 and OutB=1.

The counter is decreased by 2 to reach the (−1) counter position and the results are recorded by the test controller. Since D is greater than DLLSTP, this will result in both PD outputs equal to 1 (OutA=1 and OutB=1), as shown in FIG. 7.

From this example, the signature is +0:01, +1:01 and −1:11. The test controller recognizes that this signature is different from the set of fault-free signatures and determines the PD is faulty.

The same or similar analysis may be performed on all possible fault mechanisms. For example, eleven possible test cases were analyzed and their signatures are shown in Table 1. These cases include passing and failing cases. The passing cases all have fault-free signatures. In this table, the signatures are encoded in binary (for example, OutA=1 and OutB=0 is encoded as 2, while OutA=1 and OutB=1 is encoded as 3).

TABLE 1

| Case | Pass/Fail | Counter Position | | |
|------|-----------|----|----|----|
|      |           | +0 | +1 | −1 |
| Ideal | P | 1 | 1 | 2 |
| A | P | 1 | 1 | 2 |
| B | F | 0 | 0 | 2 |
| C | F | 1 | 1 | 3 |
| D | F | 1 | 1 | 3 |
| E | F | 0 | 0 | 2 |
| F | F | 0 | 1 | 3 |
| G | P | 0 | 1 | 3 |
| H | P | 0 | 1 | 2 |
| I | P | 0 | 1 | 2 |
| J | P | 1 | 1 | 2 |
| K | P | 0 | 1 | 2 |

In addition to cases where there is delay error on one of the inputs or only one of the PDs, Table 1 includes cases where both PDs are not ideal but still matched. There are also cases where the delays are not negligible, but are still less than DLLSTP. These cases are considered to be passing, since they do not generate a corrupted compensation setting from the counter. All gray-shaded cases (B-F) in Table 1 are cases that should fail and are considered faulty. Since all failing signatures are different from passing signatures, the proposed method does not incur yield loss or escapes.

The table may be used for lookup and comparisons. Depending on the implementation and counter positions, Table 1 may vary accordingly. For example, if the (−1) counter position is read and stored before the (+1) counter position, the signatures and the encoding may differ from that of Table 1.

It should be noted that signals entering PD 12 may be inverted such that the delayed clock signal is inputted into the clock input of PD 12 and the reference clock signal is inputted into the D input of PD 20. Correspondingly, in accordance to the signals entering PD 12, the signals entering PD 20 should be inverted as well.

It is appreciated that a design for testability technique for phase detectors used in digital feedback delay locked loops has been explained with reference to one general exemplary embodiment, and that the disclosed subject matter is not limited to the specific details given above. References in the specification made to other embodiments fall within the scope of the claimed subject matter.

Reference in the specification to "an embodiment," "one embodiment," "some embodiments," or "other embodiments" means that a particular feature, structure, or characteristic described in connection with the embodiments is included in at least some embodiments, but not necessarily all embodiments, of the claimed subject matter. The various appearances of "an embodiment," "one embodiment," or "some embodiments" are not necessarily all referring to the same embodiments.

If the specification states a component, feature, structure, or characteristic "may", "might", or "could" be included, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

Those skilled in the art having the benefit of this disclosure will appreciate that many other variations from the foregoing description and drawings may be made within the scope of the claimed subject matter. Indeed, the invention is not limited to the details described above. Rather, it is the following claims including any amendments thereto that define such scope and variations.

What is claimed is:

1. A testing circuit comprising:
   a first phase detector coupled to a reference clock and a delayed clock and capable of receiving a reference clock signal at a clock input and a delayed clock signal at a D input; and
   a second phase detector coupled to the reference clock and the delayed clock and capable of receiving the delayed clock signal at a clock input and the reference clock signal at a D input; wherein the first phase detector and the second phase detector are substantially identical; and wherein the first phase detector and the second phase detector are coupled to a test controller.

2. The testing circuit of claim 1 wherein the test controller is capable of determining whether at least one of the first phase detector or the second phase detector, or combinations thereof, is faulty.

3. The testing circuit of claim 1 further comprising an up/down counter coupled to one or more of the first phase detector and the second phase detector.

4. The testing circuit of claim 3 wherein output from the first phase detector is capable of providing an input to the up/down counter.

5. The testing circuit of claim 3 wherein output from the second phase detector is capable of providing an input to the up/down counter.

6. The testing circuit of claim 1 wherein the test controller is on-die.

7. The testing circuit of claim 1 wherein the test controller is located at a high volume manufacturing tester.

* * * * *

UNITED STATES PATENT AND TRADEMARK OFFICE
CERTIFICATE OF CORRECTION

PATENT NO. : 7,893,682 B2  Page 1 of 1
APPLICATION NO. : 12/606352
DATED : February 22, 2011
INVENTOR(S) : Benoit Provost It is certified that error appears in the above-identified patent and that said Letters Patent is hereby corrected as shown below:

Title Page, Item (54) and column 1, line 1, "Title", before "FOR TESTABILITY" insert -- DESIGN --.

Signed and Sealed this
Sixth Day of November, 2012

David J. Kappos
*Director of the United States Patent and Trademark Office*